United States Patent [19]

Matsuoka et al.

[11] Patent Number: 5,013,256
[45] Date of Patent: May 7, 1991

[54] SOCKET FOR ELECTRIC PART

[75] Inventors: Noriyuki Matsuoka; Kazumi Uratsuji, both of Tokyo, Japan

[73] Assignee: Yamaichi Electric Mfg. Co., Ltd., Tokyo, Japan

[21] Appl. No.: 497,080

[22] Filed: Mar. 21, 1990

[30] Foreign Application Priority Data

Mar. 22, 1989 [JP] Japan .................................... 1-33063

[51] Int. Cl.$^5$ ...................... H01R 13/15; H01R 11/22
[52] U.S. Cl. ...................................... 439/264; 439/267
[58] Field of Search ............... 439/259, 260, 261, 262, 439/264, 267

[56] References Cited

U.S. PATENT DOCUMENTS

| 4,505,532 | 3/1985 | Hine et al. | 439/264 |
| 4,734,047 | 3/1988 | Krumme | 439/267 |
| 4,744,768 | 5/1988 | Rios | 439/264 |

Primary Examiner—David L. Pirlot
Assistant Examiner—Julie R. Daulton
Attorney, Agent, or Firm—Wenderoth, Lind & Ponack

[57] ABSTRACT

A socket for an electric part comprises a socket body for connecting an electric part, a movable plate having a plurality of terminal insertion holes formed therein and being adapted to move along an upper surface of the socket body, a plurality of contacts in the socket body, and a no-load insertion space formed alongside each contact and adapted to facilitate a no-load insertion of a terminal of the electric part. The terminal of the electric part can be inserted into the no-load insertion space through the terminal insertion hole formed in the movable plate. The terminal can then be brought to a position in which it contacts the contact from the no-load insertion space by causing the movable plate to move laterally in one direction. Likewise, the terminal can be moved into the no-load insertion space from the contacting position by causing lateral movement of the movable plate in the other direction, in order to realize a no-load insertion and withdrawal of the electric part. The socket for the electric part further includes a member for normally urging the movable plate in the no-load insertion and withdrawal position direction so as to correctly align the no-load insertion space with the terminal insertion hole. The urging member is disposed, either directly or indirectly between the socket body and the movable plate.

10 Claims, 7 Drawing Sheets

SOCKET FOR ELECTRIC PART

BACKGROUND OF THE INVENTION

1. Field of the Invention

This invention relates to a socket for an electric part and particularly to a socket for an electric part, in which a side portion of a contact of a socket body is provided with a space for no-load insertion of a terminal of the electric part so as to realize a no-load insertion and withdrawal of the electric part in the no-load insertion space. With such a socket, by laterally moving a movable plate mounted on the socket body, a terminal of the electric part mounted on the movable plate is laterally moved from the no-load insertion space and forcefully engaged with the contact in order to realize a contact relation therebetween.

2. Brief Description of the Prior Art

FIG. 8 shows a prior art socket aimed at providing no-load insertion and withdrawal in which a side portion of a contact 3 held by a socket body 1 is provided with a no-load insertion space 4 in order to realize an insertion and withdrawal of the electric part in the no-load insertion space 4. By laterally moving a movable plate 2 mounted on the socket body 1, a terminal 6 of the electric part 5 mounted on the movable plate 2 is laterally moved from the no-load insertion space 4 and forcefully engaged with the contact 3 in order to realize a contact relation therebetween. By laterally moving the movable plate 2 in the reverse direction, the terminal 6 is brought back to the no-load insertion space 4 in order to realize a no-load insertion and withdrawal. The lateral movement of the movable plate 2 is realized by the swinging operation of an operation lever such as a crank lever. In FIG. 8, shafts 7 and 8 mounted on one end of the socket body 1 and one end of the movable plate 2 act as a supporting point and a point of application of the lever, and a transmission shaft 8 is swung about the supporting point 7 by means of the operation lever to provide lateral movement of the movable plate 2.

In the above-mentioned socket for an electric part, a terminal of the electric part mounted on the movable plate is brought to a no-load insertion space in order to allow for a no-load insertion and withdrawal of the electric part. However, the movable plate and the operation lever sometimes become loosened due to vibrations, etc. Therefore, it would become necessary to insert the electric part after the lever had been operated in order to confirm whether the movable plate was correctly positioned. If this confirmation is not carried out when the swinging operation of the operation lever and the movement of the movable plate are imperfect and are not properly moved into the no-load insertion position, the terminal of the electric part, as shown in FIG. 8, is inserted into a contact which is in a closed position. Such insertion into the closed contact causes the terminal and the contact to be deformed. In view of the foregoing, when an electric part is to be inserted into a socket by an automatic machine such as a robot, it is necessary to add a process for confirming that the movable plate is in position to allow no-load insertion. It is undesirable to add such a confirmation step to the operation processes.

The present invention has been accomplished in order to effectively overcome the above-mentioned problems inherent in the prior art.

SUMMARY OF THE INVENTION

It is therefore an object of the present invention to provide a socket for an electric part, in which terminals of the electric part can be inserted and withdrawn without being interfered with by contact of the socket.

Another object of the present invention is to provide a socket for an electric part, in which it is not necessary to confirm whether a movable plate has been properly moved to a contact releasing position.

In order to achieve the above object, there is essentially provided a socket for an electric part comprising a socket body for connecting an electric part, a movable plate having a plurality of terminal insertion holes formed therein and being adapted to move along an upper surface of the socket body, a plurality of contacts in the socket body, and a no-load insertion space formed alongside each contact and adapted to facilitate a no-load insertion of the contact of the electric part. The terminal of the electric part can be inserted into the no-load insertion space through the terminal insertion hole formed in the movable plate. The terminal can than be moved to a position for contacting the contact from the no-load insertion space by causing the movable plate to move laterally in one direction. Likewise, the contact can be moved into the no-load insertion space from the contacting position by causing the movable plate to move laterally in the other direction, in order to realize a no-load insertion and withdrawal of the electric part. The socket for the electric part further includes a member for normally urging the movable plate in the no-load insertion and withdrawal position direction so as to correctly align the no-load insertion space with the terminal insertion hole. The urging member is, either directly or indirectly, disposed between the socket body and the movable plate. The urging member may be a coil spring.

According to the above-mentioned construction, when the movable plate has been laterally moved to the no-load insertion and withdrawal position, it is prevented from floating or being loosened by a resilient force of the urging member which normally urges the movable plate into the no-load insertion and withdrawal position so as to maintain it in that position. This facilitates the insertion and withdrawal of the terminal of the electric part without interference between the contact and the terminal.

Accordingly, the movable plate can be accurately moved into the no-load insertion and withdrawal position (contact releasing position) and a correct alignment between the insertion hole and the no-load insertion space can be obtained. As a result, the above-mentioned confirmation operation is no longer necessary.

Other objects and advantages of the present invention will become readily apparent to those skilled in the art from the following detailed description, wherein only the preferred embodiment of the invention is shown and described, simply by way of illustration of the best mode for carrying out the present invention. As will be realized, the invention is capable of other and different embodiments, and its several details are capable of other and different embodiments without departing from the spirit of the present invention. Accordingly, the drawings and description are to be regarded as illustrative in nature, and not as restrictive.

BRIEF DESCRIPTION OF THE DRAWINGS

FIG. 1(A) shows a contact released state and FIG. 1(B) shows a contacting state;

FIG. 2(A) is a contact released state and FIG. 2(B) shows a contacting state;

FIG. 3(A) shows a contact released state and FIG. 3(B) shows a contacting state;

FIG. 4(A) shows a contact released state and FIG. 4(B) shows a contacting state;

DETAILED DESCRIPTION OF THE EMBODIMENTS

Figure 1A:
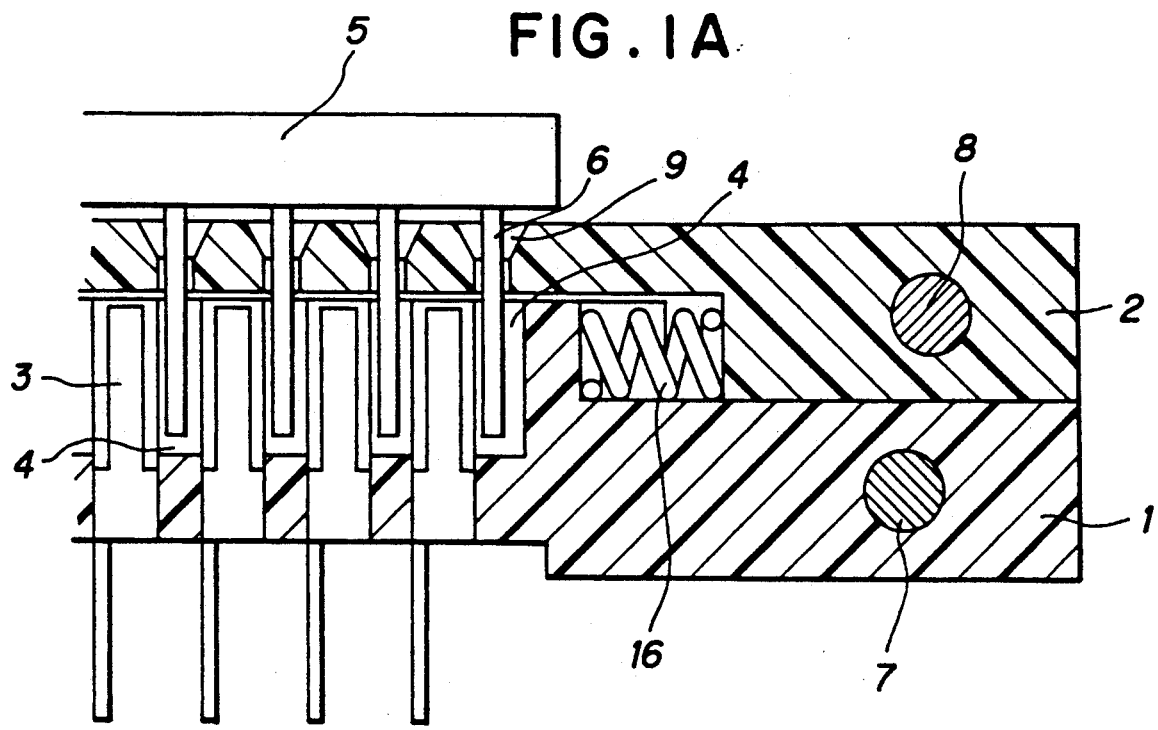
FIGS. 1(A) and 1(B) are sectional views of a socket for an electric part in accordance with a first embodiment of the present invention.

The embodiments of the present invention will be described hereunder with reference to FIGS. 1 through 7.

The reference numeral 1 denotes a socket body for an electric part which is to be mounted on a distributing board, etc. The socket body 1 has a plurality of contacts 2 arranged thereon in order to be contacted with a plurality of terminals 6 of an electric part 5. A movable plate 2 is provided and is laterally movable along a upper surface of the socket body 1.

In the socket shown in this embodiment, the movable plate 2 is superposed on the upper surface of the socket body 1 which is made of an insulating material and has a generally rectangular shape. The movable plate 2 has a plurality of holes 9 for permitting the terminals 6 of the electric part 5 to be inserted therein and arranged in a lattice shape on the movable plate 2. The electric part 5 such as an IC, etc. is mounted on the upper surface of the movable plate 2 with the terminals 6 inserted into the terminal insertion holes 9. Furthermore, a no-load insertion space 4 is provided to a side portion of each of the contacts 3. As is shown in FIGS. 1(A), 2(A), 3(A) and 4(A), the tips of the terminals 6 are inserted into the terminal insertion holes 9 in order to realize a no-load insertion into or no-load removal from the terminal no-load insertion spaces 4.

In this way, as is shown in FIGS. 1(B), 2(B), 3(B) and 4(B), by laterally moving the movable plate 2 in one direction from the no-load insertion and removal position (contact releasing position), the terminal 6 inserted in the terminal insertion holes 9 are moved from the contact releasing position to a position in which they are in contact with contact 3 (contacting position), and by laterally moving the movable plate 2 in the other direction, the terminals 6 are moved from the contacting position to the contact releasing position.

When the terminals 6 are moved from the contact releasing position to the contacting position, the terminals 6 are forcefully engaged with the contact 3. The terminals are normally in the releasing position due to a resilient force thereagainst and obtain a contact relation with the contact 3 when external pressure is applied. By moving the terminal 6 from the contacting position to the contact releasing position, the terminals 6 are disengaged from the contacts 3 and brought into the no-load insertion spaces 4.

Figure 6:
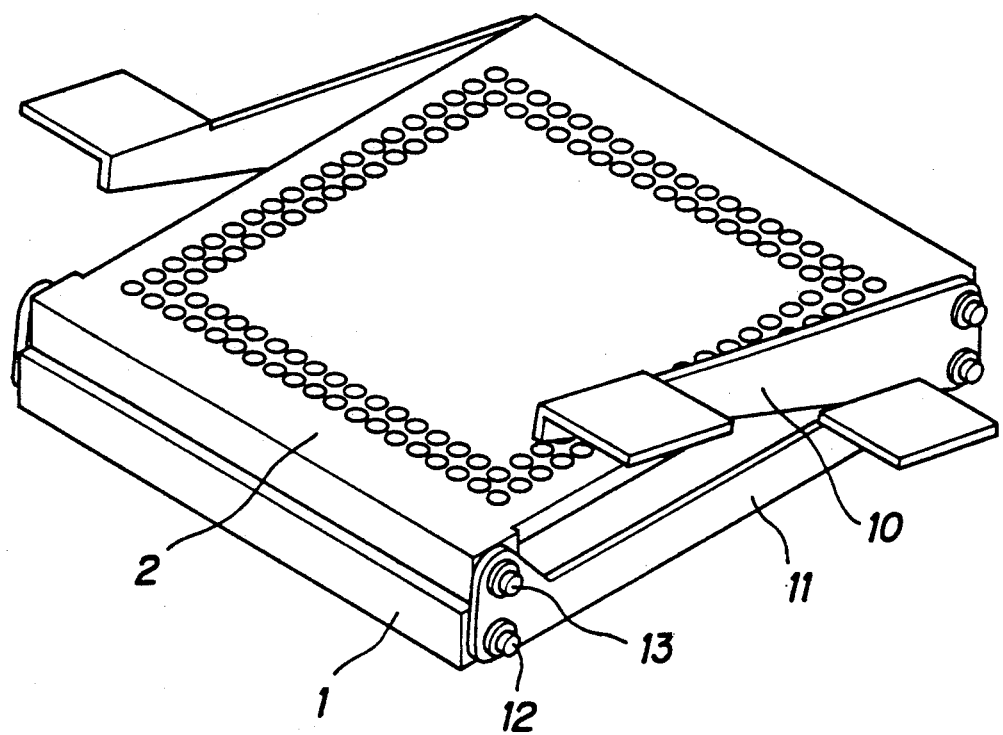
FIG. 6 is a perspective view of a socket for an electric part and shows an example of an operation lever.

The example shown in FIG. 6 includes a contacting operation lever 10 as an operation means for laterally moving the movable plate 2 in one direction and a contact releasing operation lever 11 for laterally moving the movable plate 2 in the other direction. One end of the contacting operation lever 10 is pivotably mounted on a side surface of one end of the socket body 1 by a supporting shaft 7, and one end of the operation lever 10 is pivotally connected to a side surface of one end of the movable plate 2 by a transmission shaft 8. The transmission shaft 8 is disposed such that when the contacting operation lever 10 is pivoted about the supporting shaft 7, the shaft 8 imparts a lateral force to the movable plate 2 in one direction to cause it to move.

Furthermore, one end of a contact releasing operation lever 11 is pivotably mounted on a side surface of the other end of the socket body 1 by a supporting shaft 12, and one end of the operation lever 11 is pivotally connected to a side surface of the other end of the movable plate 2 by a transmission shaft 13. The transmission shaft 13 is disposed such that when the contact releasing operation lever is pivoted about the supporting shaft 12, the shaft 13 imparts a lateral force to the movable plate 2 in the other direction to cause it to move.

Figure 5A:
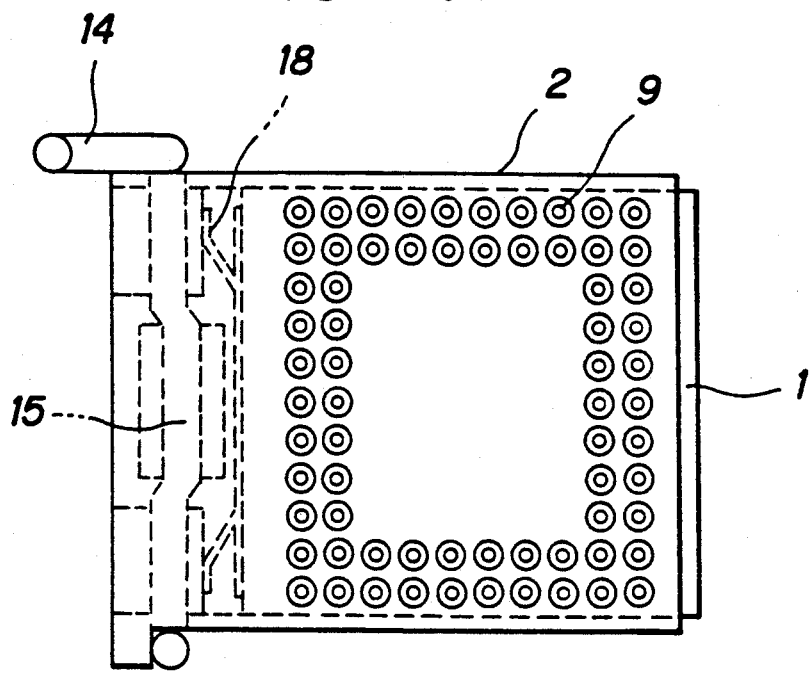
FIG. 5(A) is a plan view of a socket for an electric part in accordance with a fifth embodiment.
Figure 7:
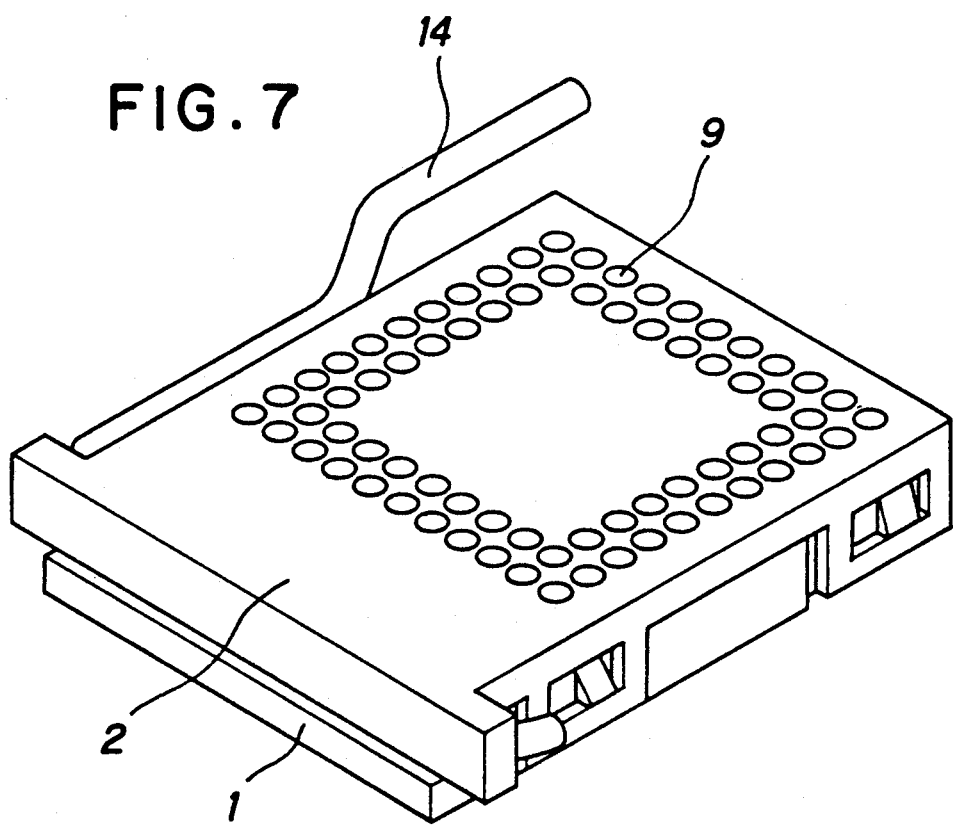
FIG. 7 is a perspective view of the socket showing another example of the operation lever.
Figure 8:
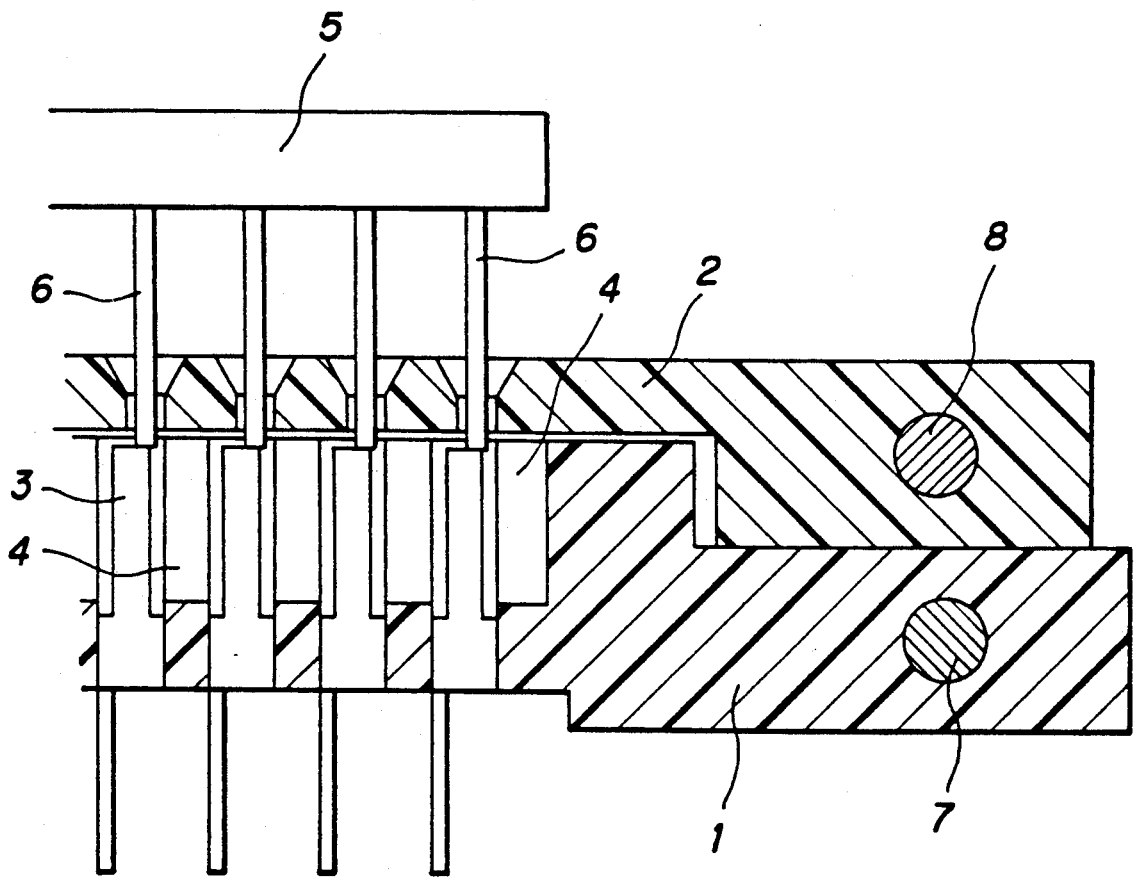
FIG. 8 is a section view of a conventional socket for an electric part.

FIGS. 7 and 5(A) show another example of an operation means for laterally moving the movable plate 2. In this example, a crank portion 15 of a crank lever 14 is disposed in the superposed ends of the movable plate 2 and the socket body 1 so that the movable plate 2 is laterally moved in one direction or in the other direction upon operation of the lever 14 through eccentric motion of the crank portion 15. Such operation lever as exemplified above is suitably used in the respective embodiments which will be described hereinafter.

Figure 1B:
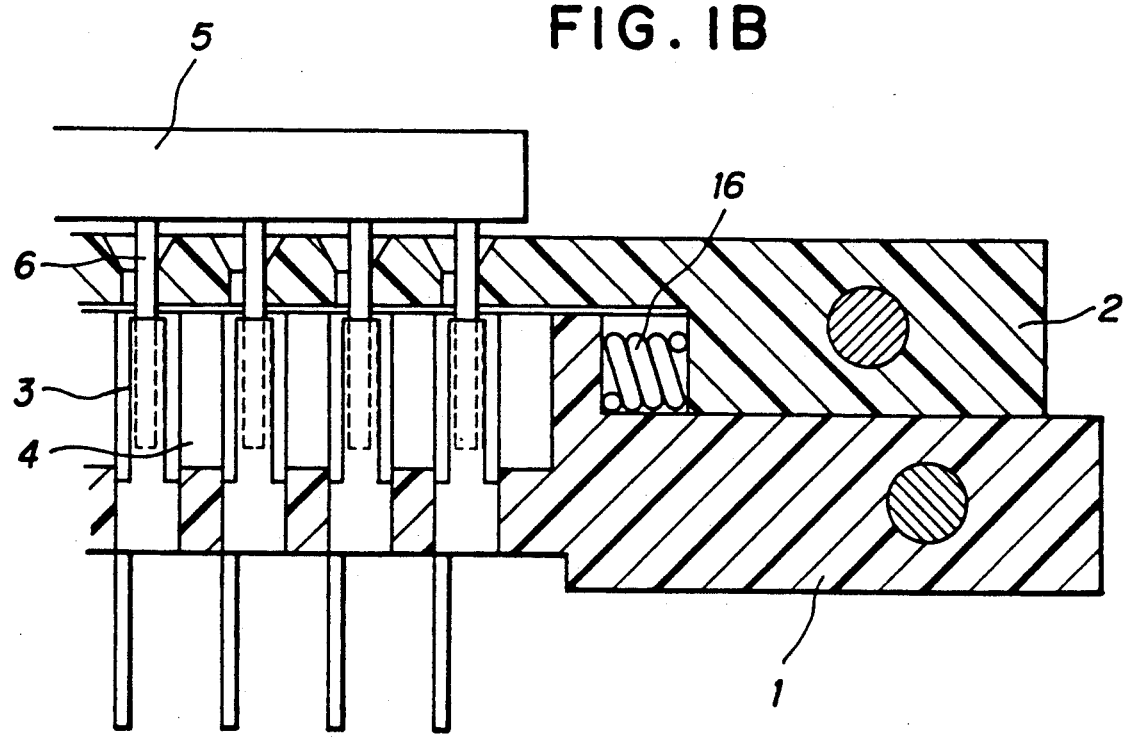

A socket for an electric part constructed in the manner mentioned above can be provided with a coil spring 16 interposed between the socket body 1 and the movable plate 2 and adapted to normally urge the movable plate 2 in the contact releasing direction as shown in FIGS. 1(A) and 1(B). As is shown in FIG. 1(A), the coil spring 16 maintains movable plate 2 in position to allow the terminals 6 in the no-load insertion spaces 4 to be released from contact with the contacts 3 and to be inserted and withdrawn with no load thereagainst.

That is, as is shown in FIG. 1(A), the coil spring 16 resiliently urges the movable plate 2 in one direction (rightward direction in the drawing) and no pivoting force is imparted to the operation lever. When the terminals 6 of the electric part 5 are not engaged with the contacts 3 of the socket body 1 (when the contacted relation is released), the position of the movable plate 2 is maintained such that the terminals 6 can remain in the no-load insertion space 4, due to the coil spring 16. In this state, the terminals 6 of the electric part 5 can be inserted into or withdrawn from the no-load insertion spaces 4 of the socket body 1 under no load through the terminal insertion holes 9 of the movable plate 2.

Next, as is shown in FIG. 1(B), when the movable plate 2 is moved in the other direction (leftward direction in the drawing) against the coil spring 16 by the operation lever, the terminals 6 of the electric part 5 are forcefully engages against the contacts 3 of the socket body 1 in order to realize the contacting relation therebetween. The resilient force of the coil spring 16 is designed to be much smaller than the sum of the contact resistances of the contacts 3 in pinching the terminals 6 so that the terminals 6 are not pushed through the contacts 3. Also, it may be designed such that the resilient force of the coil spring 16 is optionally set and a lock apparatus (not shown) is mounted on the movable plate 2 or the operation lever.

Next, in order to release the contacting relation between the terminals 6 and the contact 3, the operation lever is pivoted so as to laterally move the movable plate 2 in the rightward direction from the state shown in FIG. 1(B) to the state shown in FIG. 1(A), or the lock apparatus is brought into a free state (unlocked) and the movable plate 2 is laterally moved by the resilient force of the coil spring 16, the movable plate 2 is maintained in the no-load insertion and withdrawal position (i.e. the holes 9 are aligned with the no-load insertion spaces 4). In this manner, no-load insertion and withdrawal of the electric part 5 can be performed without having to perform a confirmation step to confirm that the holes 9 are properly aligned with the spaces 4.

Figure 2A:
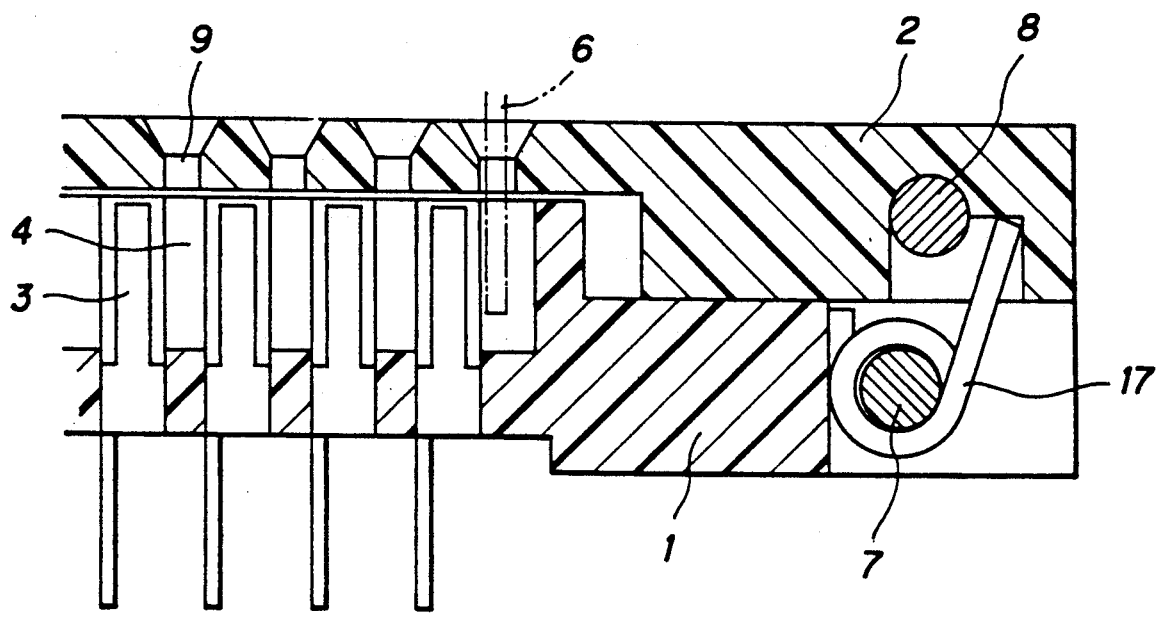
FIGS. 2(A) and 2(B) are sections views of a socket for an electric part in accordance with a second embodiment.
Figure 2B:
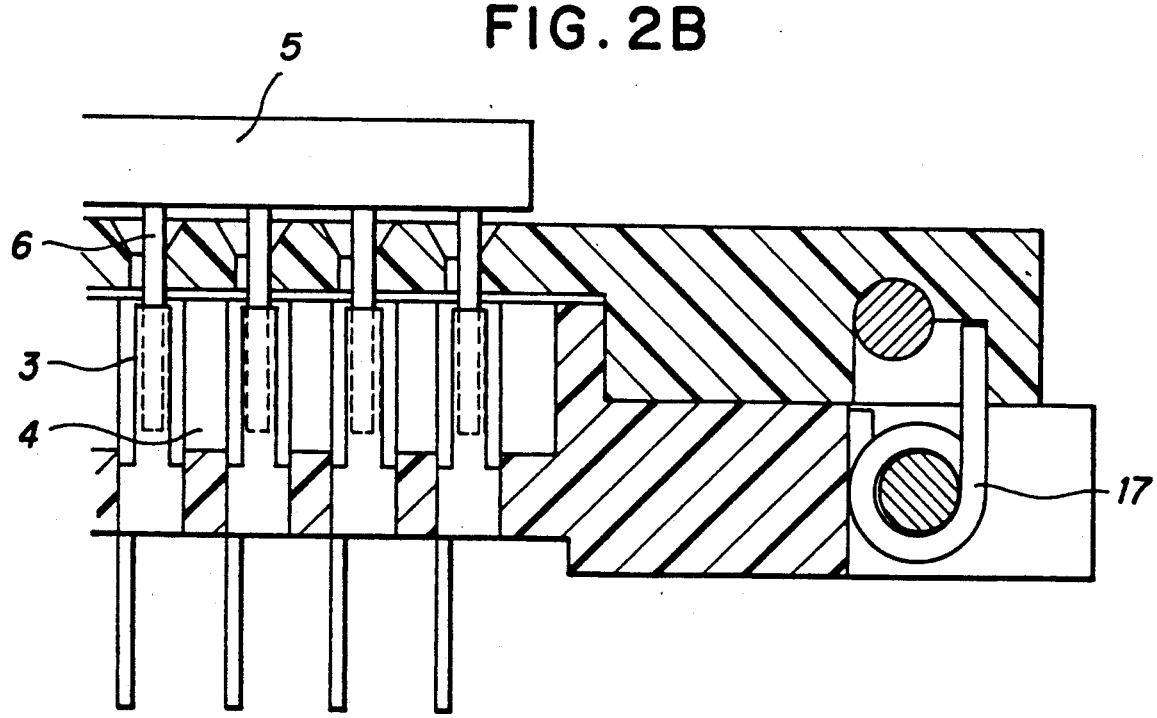
Figure 3A:
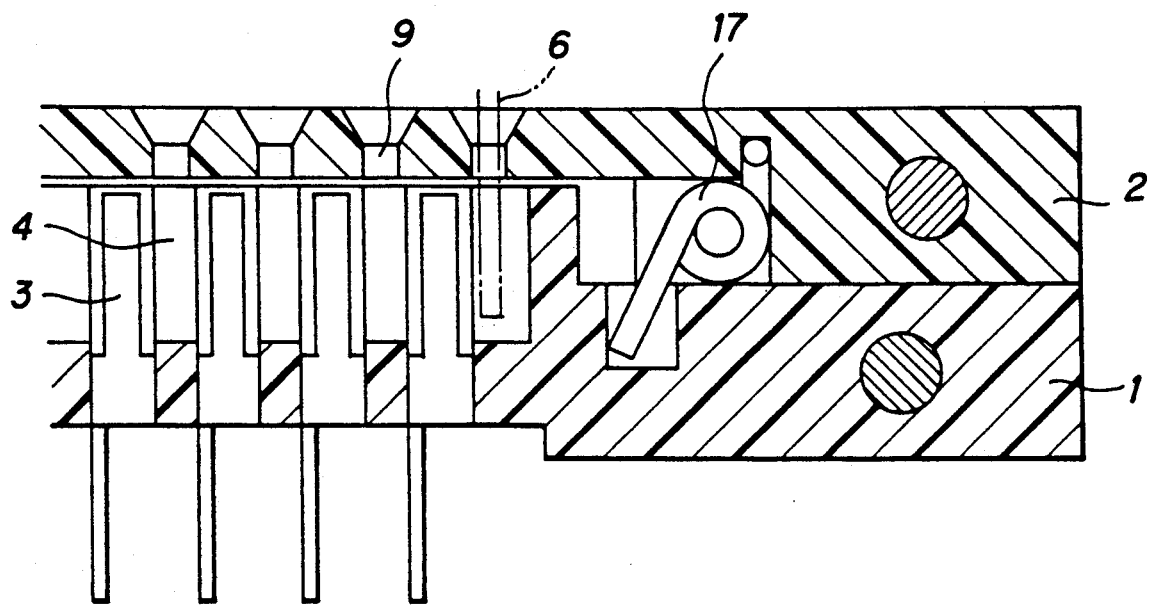
FIGS. 3(A) and 3(B) are sectional views of a socket for an electric part in accordance with a third embodiment.
Figure 3B:
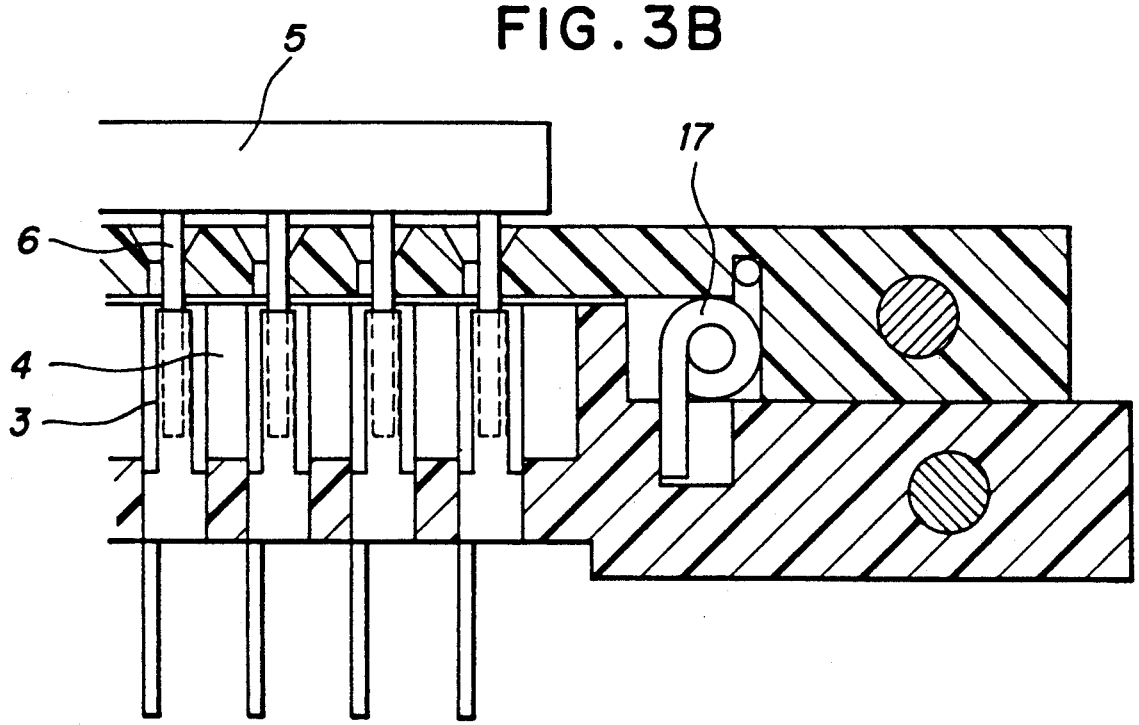

In FIGS. 2(A) and 2(B), a winding spring 17 is axially supported on one end portion of the socket body 1, for example, axially supported by using the above-mentioned supporting shaft 7, and one end of the spring is engaged with the movable plate 2 in order to urge the movable plate 2 in the contact releasing direction. As is shown in FIGS. 3(A) and 3(B), it may be designed such that the winding spring 17 is axially supported on one end portion of the movable plate 2 and one end of the spring in engages with the socket body 1. In any case, there can be obtained the same motion as described in FIGS. 1(A) and 1(B), and the floating or loosening of the movable plate 2 is prevented and the contact releasing position can be maintained.

Figure 4A:
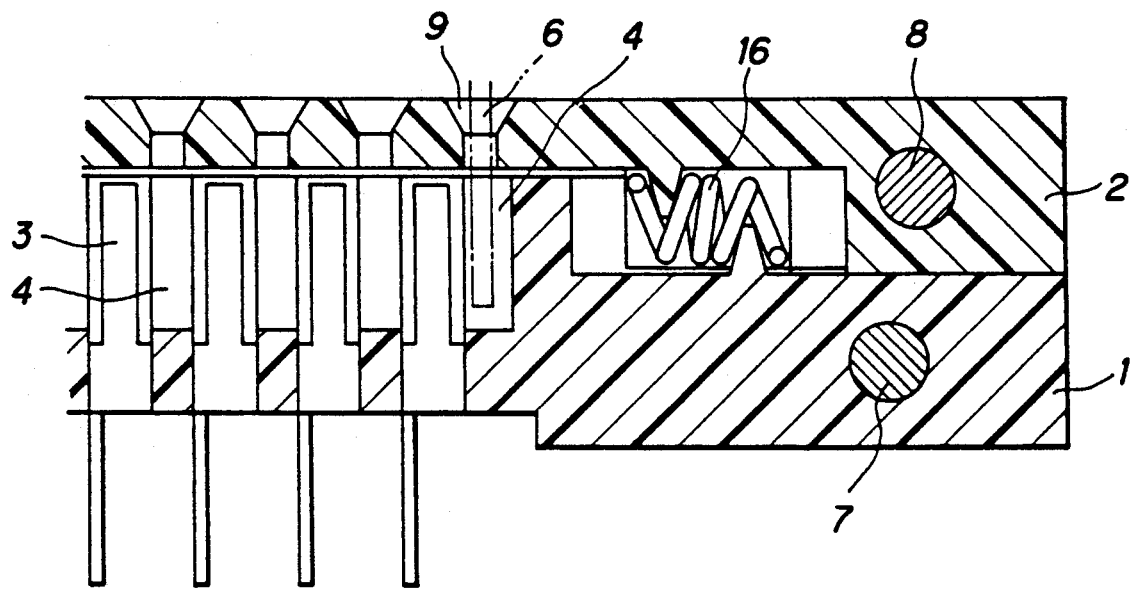
FIG. 4(A) and 4(B) are sectional views of a socket for an electric part in accordance with a fourth embodiment.
Figure 4B:
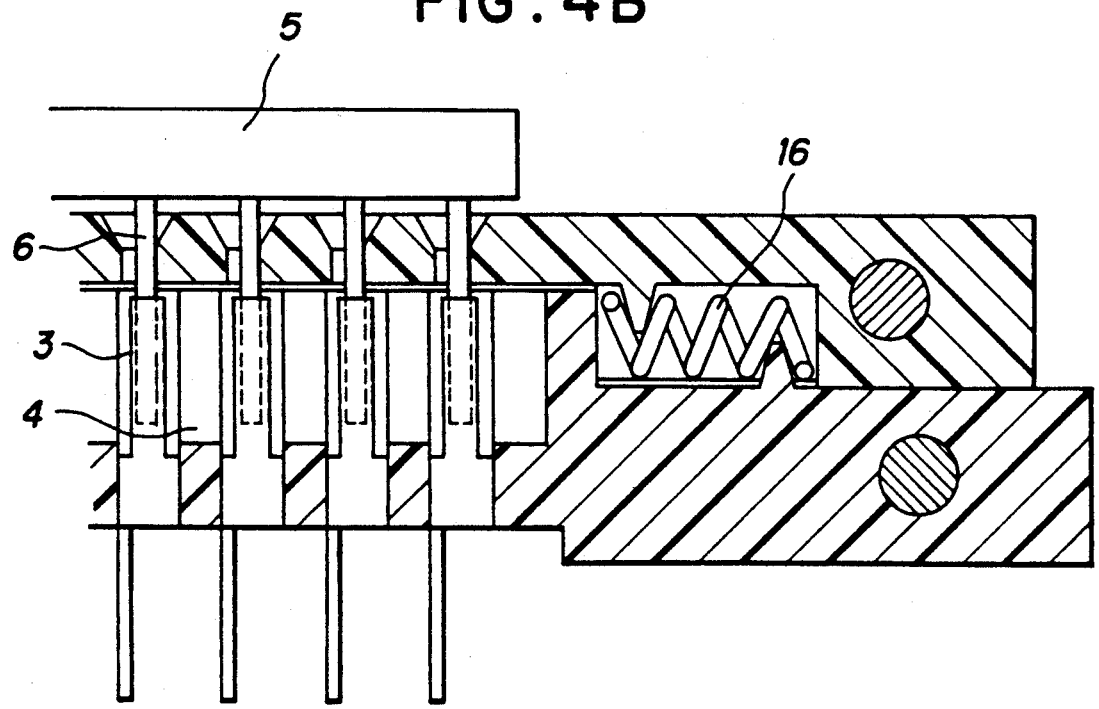

Furthermore, in the example of FIGS. 4(A) and 4(B), contrary to the embodiment of FIGS. 1(A) and 1(B), the movable plate 2 is urged in the contact releasing direction utilizing a tensile force of the coil spring 16 to thereby secure the no-load insertion and withdrawal position of the movable plate for the terminals 6. One end of the coil spring 16 is fixed to the socket body 1 side and the other end is fixed to the movable plate 2 side in order to utilize the tensile force of the spring. By moving the movable plate 2 while expanding the coil spring 16 as shown in FIG. 4(B), a contacted relation of the terminals 6 with the contacts 3 can be obtained.

Figure 5B:
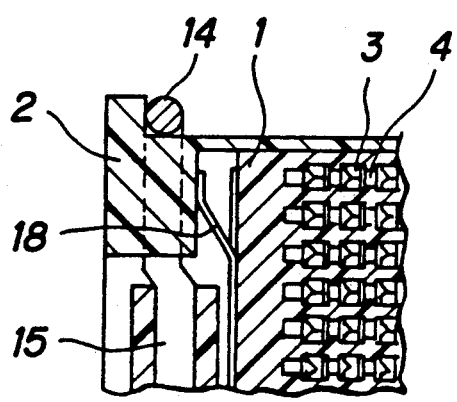
FIG. 5(B) is a sectional view showing a contact released state thereof and FIG. 5(C) is a sectional view showing a contacting state thereof.
Figure 5C:
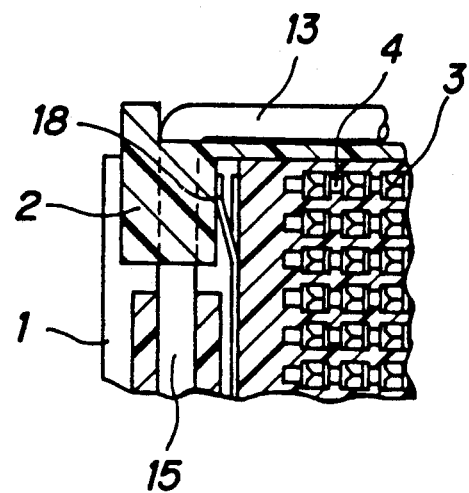

In FIG. 5(A), 5(B) and 5(C), a plate spring 18 instead of the coil spring 16 is interposed between the socket body 1 and the movable plate 2 in order to urge the movable plate 2 in the contact releasing direction to thereby maintain the movable plate in the no-load insertion position and allow the terminals 6 to remain in the no-load insertion spaces.

As for the plate spring 18, for example, the crank portion 15 of the crank lever 14 is interposed between the adjacent ends of the movable plate 2 and the socket body 1 and is mounted in parallel relation therewith. A central portion of the plate spring 18 is fixed to the socket body 1 side and both ends of the plate spring 18 are resiliently engaged with the movable plate 2 side in order to obtain lateral movement of the movable plate 2 without displacing the movable plate 2 in the wrong direction. The crank portion 15 is disposed in such a manner that the eccentric shaft portion of the crank portion 15 is located at the central portion of this plate spring 18 in order to obtain a good balance.

As for urging the movable plate in the direction of the no-load insertion position, other members which can provide a suitable restoring force may be used besides the above-mentioned spring members such as the coil spring, the winding spring, the plate spring, etc.

Although not illustrated, it may be designed such that a spring member is interposed between the operation lever and the socket body 1 in order to urge the movable plate 2 in the contact releasing direction. In this case, a biasing force is indirectly exerted against the movable plate 2 in the contact releasing direction through the operation lever and the spring member is indirectly interposed between the movable plate 2 and the socket body 1. Thus, this is also within the scope of the present invention as in the case where the spring member is directly interposed. Likewise, when a spring member is interposed between the operation lever and the movable plate 2 in order to urge the movable plate 2 in the contact releasing direction, the same effect can be obtained.

As described in the foregoing, according to the present invention, there is provided a socket for an electric part comprising a socket body for connection an electric part, a movable plate having a terminal insertion hole formed therein and adapted to move along an upper surface of said socket body, and a no-load insertion space formed alongside each contact of said socket body and adapted to facilitate a no-load insertion of terminal of the electric part mounted on said movable plate. The terminal of the electric part is inserted into the no-load insertion space through the terminal insertion hold formed in the movable plate. The terminal is then brought to a position for contacting the contact from the no-load insertion space in accordance with a lateral movement of the movable plate in one direction. Likewise, the terminal is brought into the no-load insertion space from the contacting position in accordance with a lateral movement of the movable plate in the other direction in order to realize a no-load insertion and withdrawal of the electric part. The socket for the electric part further includes a member for normally urging the movable plate in the no-load insertion and withdrawal position direction so as to correctly align the no-load insertion space with the terminal insertion hole. The urging member which is preferably a spring member, is disposed, either directly or indirectly between the socket body and the movable plate. Accordingly, the terminal of the electric part is not interfered with in that position and can be inserted and withdrawn smoothly.

Furthermore, as the movable plate is correctly laterally moved into the contact releasing position by the spring member so as to obtain proper alignment of the insertion holes with the no-load insertion space, the terminal will no longer hit the contact when the terminal is inserted such that deformation of the terminal and the contact no longer occurs. In addition, with the present invention, it is unnecessary to confirm whether the movable plate has been properly moved into the contact releasing position.

In this disclosure, only the preferred embodiments have been shown and described, but, as aforementioned, it is to be understood that the present invention is capable of various changes and modification within the scope of the inventive concept as expressed herein.

What is claimed is:

1. A socket for receiving at least one terminal of an electrical part, comprising:
    a socket body having at least one electrical contact mounted therein and at least one no-load insertion space formed adjacent said at least one contact, respectively;
    a movable plate having at least one terminal insertion hole formed therethrough, and being slidably mounted on said socket body for slidable movement between a no-load insertion position in which said at least one terminal insertion hole is aligned with said at least one no-load insertion space, respectively, so as to allow the at least one terminal to be respectively inserted through said at least one terminal insertion hole and into said at least one no-load insertion space without encountering resistance from said at least one contact, and a contacting position in which said at least one terminal insertion hole is misaligned with respect to said at least one no-load insertion space, respectively, and in which, when said at least one terminal is inserted through said at least one terminal insertion hole, said at least one terminal is engaged with said at least one contact, respectively; and
    biasing means for continuously urging said movable plate toward said no-load insertion position with a force insufficient to disengage the at least one terminal from said at least one contact but sufficient to move said plate into said no-load insertion position when the at least one terminal is not engaged with said at least one contact, respectively.

2. A socket as recited in claim 1, wherein said biasing means comprises a coil spring operatively interposed between said socket body and said movable plate.

3. A socket as recited in claim 1, wherein said biasing means comprises a winding comprises a winding spring operatively interposed between said socket body and said movable plate.

4. A socket as recited in claim 1, wherein said biasing means comprises a plate spring operatively interposed between said socket body and said movable plate.

5. A socket as recited in claim 1, wherein said at least one terminal insertion hole, said at least one contact, and said at least one no-load insertion space comprise a plurality of terminal insertion holes, a plurality of contacts, and a plurality of no-load insertion spaces, respectively.

6. A socket as recited in claim 1, wherein said biasing means is further operable to prevent rattling of said movable plate relative to said socket body.

7. A socket as recited in claim 6, further comprising means for forcing said movable plate to slide into said contacting position against the biasing force of said biasing means.

8. A socket as recited in claim 7, wherein said forcing means comprises an operation lever operatively connected to both said socket body and said movable plate.

9. A socket as recited in claim 1, further comprising means for forcing said movable plate to slide into said contacting position against the biasing force of said biasing means.

10. A socket as recited in claim 1, wherein said forcing means comprises an operation lever operatively connected to both said socket body and said movable plate.

* * * * *